(12) United States Patent
Yoshimoto et al.

(10) Patent No.: US 6,824,643 B2
(45) Date of Patent: Nov. 30, 2004

(54) METHOD AND DEVICE OF PEELING SEMICONDUCTOR DEVICE USING ANNULAR CONTACT MEMBERS

(75) Inventors: Kazuhiro Yoshimoto, Kawasaki (JP); Kazuo Teshirogi, Kawasaki (JP); Eiji Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 90 days.

(21) Appl. No.: 10/086,729

(22) Filed: Mar. 4, 2002

(65) Prior Publication Data

US 2003/0075271 A1 Apr. 24, 2003

(30) Foreign Application Priority Data

Oct. 23, 2001 (JP) ........................................ 2001-325113

(51) Int. Cl.$^7$ ............................................. B32B 35/00
(52) U.S. Cl. ...................... 156/344; 156/584; 438/464; 438/976; 29/426.6
(58) Field of Search ............................... 156/344, 584; 438/464, 976, FOR 386; 29/426.1, 426.3, 426.4, 426.5, 426.6

(56) References Cited

U.S. PATENT DOCUMENTS 3,785,507 A * 1/1974 Wiesler et al. ................ 29/700
4,850,780 A * 7/1989 Safabakhsh et al. ........ 414/416.1
2003/0077854 A1 * 4/2003 Teshirogi et al. ............ 438/113

FOREIGN PATENT DOCUMENTS

| EP | 1304728 | * | 4/2003 | |
| JP | 62-166536 | * | 7/1987 | .................. 156/584 |
| JP | 2-66957 | * | 3/1990 | .................. 156/584 |
| JP | 6-338527 | | 12/1994 | |
| JP | 10-189690 | | 7/1998 | |
| JP | 2000-353710 | * | 12/2000 | |
| JP | 2001-118862 | | 4/2001 | |

* cited by examiner

*Primary Examiner*—Mark A. Osele
(74) *Attorney, Agent, or Firm*—Westerman, Hattori, Daniels & Adrian, LLP

(57) ABSTRACT

In a semiconductor device manufacturing process, a semiconductor wafer is diced into a plurality of semiconductor chips, which are then peeled, from a dicing tape, using a peeling device. The peeling device includes a plurality of annular contact members arranged one after another from the outside to the inside, and the annular contact members are operated so that the semiconductor chip is successively peeled from the tape from the outer circumferential portion thereof toward the central portion thereof.

2 Claims, 6 Drawing Sheets

METHOD AND DEVICE OF PEELING SEMICONDUCTOR DEVICE USING ANNULAR CONTACT MEMBERS

BACKGROUND OF THE INVENTION

1. Field of the Invention

The present invention relates to a method of peeling a semiconductor chip used in a semiconductor device manufacturing process. Also, the present invention relates to a device therefor.

2. Description of the Related Art

Conventionally, a semiconductor device is manufactured in such a manner that, for example, a plurality of semiconductor elements are formed on the first surface of a silicon wafer (semiconductor substrate), and this silicon wafer is diced so as to separate the semiconductor elements (silicon chips) from each other. The silicon wafer is adhered to a dicing tape before the dicing, and when dicing is completed, the silicon chips, which are separated from each other, are adhered to the dicing tape. The silicon chip is peeled from the dicing tape, by a peeling device, before die-bonding.

In order to peel the silicon chip from the dicing tape, a needle device 34 shown in FIG. 11 is conventionally used. The needle device 34 includes needles 34A. The needles 34A are moved from the lower side of the dicing tape 24 toward the dicing tape 24 and penetrate the dicing tape 24 so that the silicon chip 16 is lifted. There is also provided a needle device in which the needles 34A do not penetrate the dicing tape 24.

Japanese Unexamined Patent Publication No. 10-189690 discloses a peeling device, in which needles are arranged at positions close to the four corners and at a position close to the center of a silicon chip. The needles arranged at the positions close to the four corners are operated first, and then the needle arranged at the position close to the center is operated, so that the silicon chip can be peeled off stepwise from the four corner portions toward the central portion.

Japanese Unexamined Patent Publication No. 6-338527 discloses a peeling device in which needles are not used but a silicon chip is peeled off from a dicing tape by attracting the dicing tape from the lower side thereof by a peeling device having suction grooves. Japanese Unexamined Patent Publication No. 2001-118862 discloses a peeling device in which a dicing tape is peeled off from a dicing tape, by attracting the dicing tape from the lower side thereof by suction grooves and moving a stage in parallel.

Recently, there has been an increasing demand for reducing the thickness of a silicon wafer and the thickness of silicon chips. However, as the thickness of the silicon wafer is reduced, it becomes difficult to peel the silicon chips from the dicing tape. For example, when the thickness of the silicon chip is reduced, there is a tendency that the needles pierce the silicon chip after they have penetrated the dicing tape.

Further, when the thickness of the silicon chip is reduced, it tends to be deformed. For example, as shown in FIG. 12, the dicing tape 24 and the silicon chip 16 are deformed into concaved shapes at positions where the needles 34A come into contact with the dicing tape 24 and the silicon chip 16 as shown in FIG. 12. Therefore, the silicon chip 16 may be damaged or cracked. A similar problem arises in a case where the dicing tape is attracted from the lower side thereof by suction grooves.

Further, in order to peel the silicon chip 16 off from the dicing tape 24, it is necessary that air enters the interface between the silicon chip 16 and the dicing tape 24 and spreads over the interface. In the case where the needles do not penetrate and tear the dicing tape 24, air does not enter the interface first at the central portion of the silicon chip 16, but air enters the interface in the outer circumferential portion of the silicon chip 16. Therefore, peeling occurs only in the outer circumferential portion of the silicon chip 16. In the circumstance shown in FIG. 12, it becomes difficult for the silicon chip 16 to be peeled off from the dicing tape 24, and the silicon chip 16 tends to be damaged.

SUMMARY OF THE INVENTION

It is an object of the present invention to provide a method of peeling a semiconductor chip and a device thereof capable of securely peeling a semiconductor chip off from a dicing tape even when the thickness of the semiconductor chip is thin.

A method of peeling a semiconductor chip, according to the present invention, comprises the steps of peeling a semiconductor chip, adhered to a tape, from the tape using a peeling device including a plurality of annular contact members arranged one after another from the outside to the inside, wherein the plurality of annular contact members are operated so that the semiconductor chip is successively peeled off from the tape from an outer circumferential portion thereof toward a central portion thereof.

A device of peeling a semiconductor chip, adhered to a tape, from the tape, according to the present invention, comprises a plurality of annular contact members arranged one after another from the outside to the inside, and an operation device for operating the plurality of annular contact members so that the semiconductor chip is successively peeled off from the tape from an outer circumferential portion thereof to a central portion thereof.

In the above method and device, the semiconductor chip is successively peeled off from the tape from the outer circumferential portion toward the central portion by the peeling device including a plurality of annular contact members which are arranged one after another from the outside to the inside in order. Accordingly, even when the thickness of the semiconductor chip is small, the semiconductor chip can be securely peeled off from the tape.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

An Embodiment of the present invention will now be explained with reference to the drawings. A typical example of a series of steps of a method of manufacturing a semiconductor device will be explained, referring to FIGS. 10A to 10F.

Figure 10A:
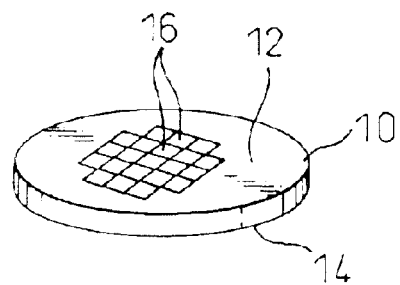
FIGS. 10A to 10F are views showing a typical example of a series of steps of a method of manufacturing a semiconductor device.
Figure 10B:
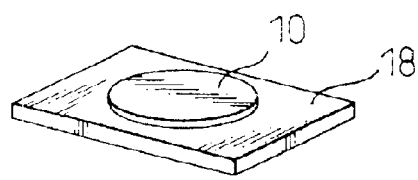

FIG. 10A is a view illustrating a silicon wafer (semiconductor substrate) which is subjected to an integrated circuit forming process. The silicon wafer 10 has a first surface 12 and a second surface 14. A plurality of semiconductor elements (silicon chips) 16 have been formed on the first surface 12 of the silicon wafer 10 during the integrated circuit forming process. In FIG. 10B, a protection tape 18 is adhered to the first surface 12 of the silicon wafer 10.

Figure 10C:
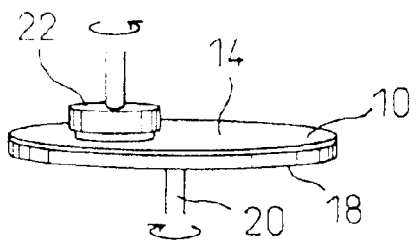

In FIG. 10C, the second surface 14 of the silicon wafer 10 is ground in a state that the protection tape 18 is adhered to the first surface 12 of the silicon wafer 10. In this example, a diamond grinding wheel 22 which is a mechanical processing tool grinds the second surface 14 of the silicon wafer 10, in a state that a rotary support member 20 supports the silicon wafer 10 on side of the protection tape 18. During the grinding, the first surface 12 of the silicon wafer 10 on which the semiconductor elements 16 are formed is protected by the protection tape 18. In this step, the silicon wafer 10 is ground to have a predetermined thickness.

Figure 10D:
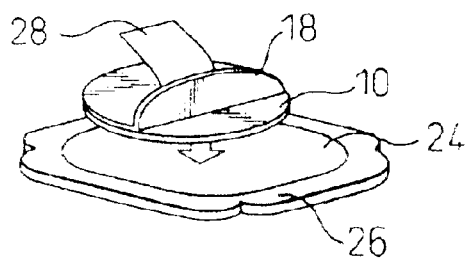

In FIG. 10D, the second surface 14 of the silicon wafer 10 is adhered onto a dicing tape 24 and the protection tape 18 is peeled off from the first surface 12 of the silicon wafer 10. The dicing tape 24 is adhered onto a wafer ring 26, and the protection tape 18 is peeled, for example, by a double-sided adhesive tape 28. Before the protection tape 18 is peeled, the protection tape 18 is irradiated with ultraviolet light.

Figure 10E:
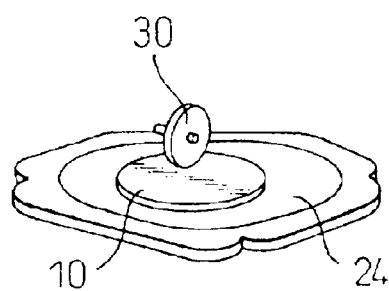
Figure 10F:
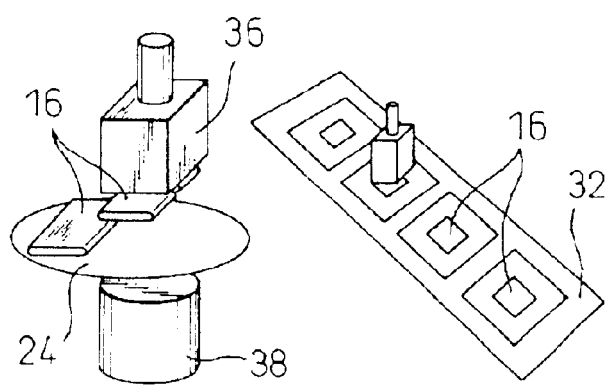

In FIG. 10E, the silicon wafer 10 is diced and separated by a dicer 30, in a state that the silicon wafer 10 is adhered to the dicing tape 24. The separated silicon chips 16 are still adhered to the dicing tape 24. After the completion of dicing, the dicing tape 24 is irradiated with ultraviolet light. In FIG. 10F, the silicon chips 16 are die-bonded to a lead frame 32. In this case, each silicon chip 16 is peeled off from the dicing tape 24 by a peeling device 38 and conveyed to the lead frame 32 by a suction head 36.

Figure 1:
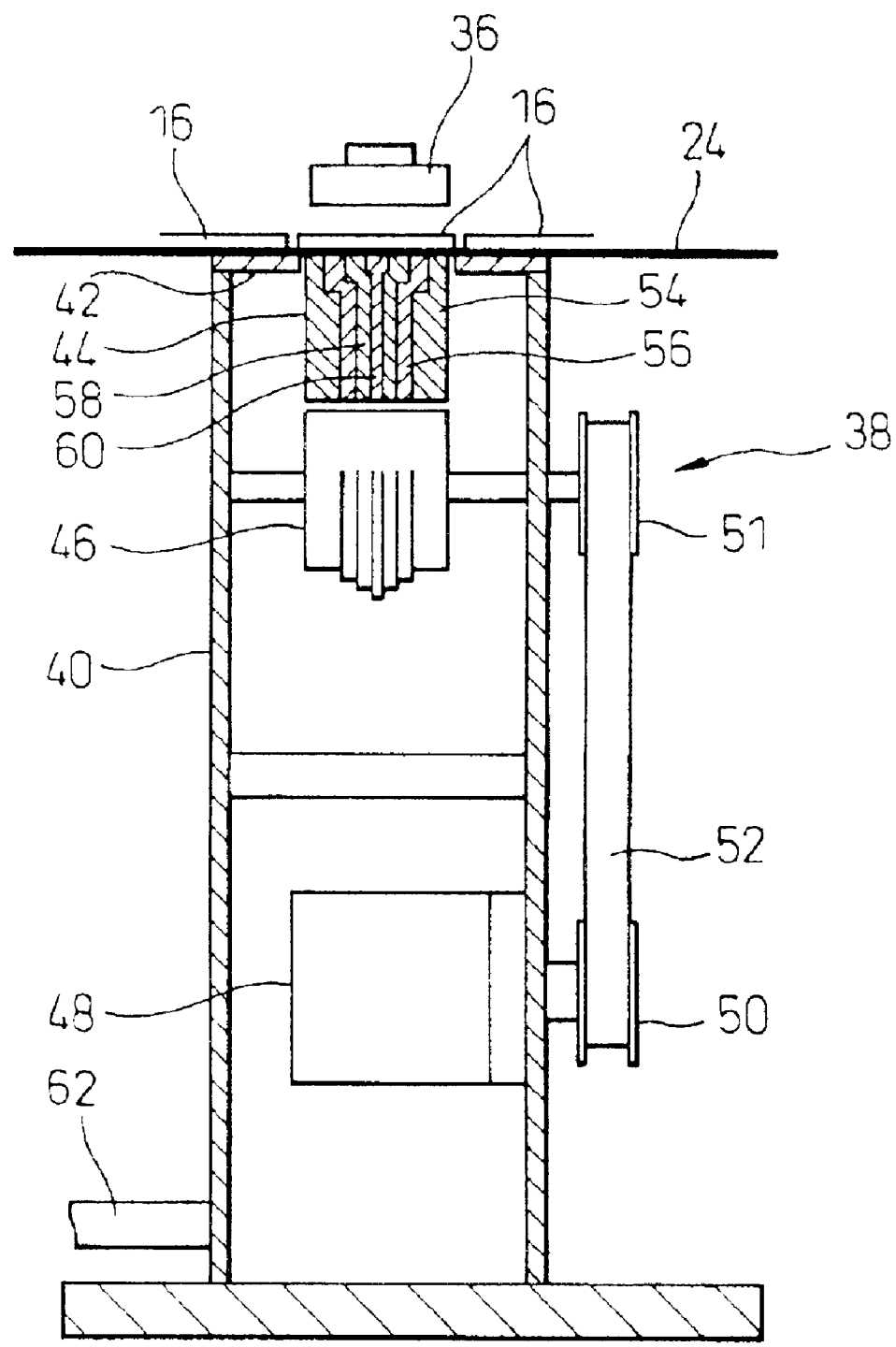
FIG. 1 is a sectional view showing a method and a device of peeling a semiconductor chip according to an embodiment of the present invention.
Figure 11:
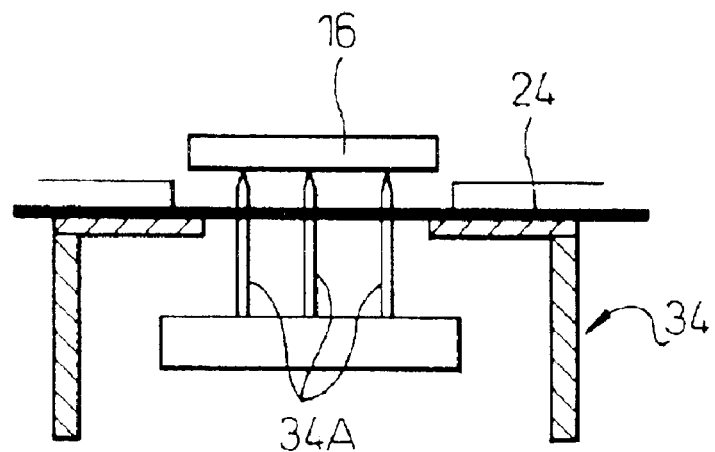
FIG. 11 is a view showing a conventional needle device used for peeling a semiconductor wafer.
Figure 12:
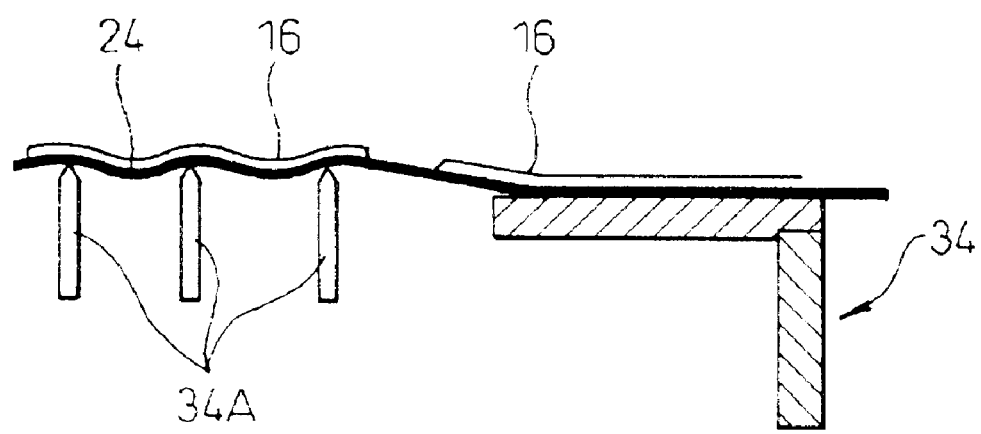
FIG. 12 is a view showing a semiconductor chip deformed in the step of peeling when the semiconductor chip is thin.

FIG. 1 is a sectional view showing a method and a device of peeling a semiconductor chip according to the embodiment of the present invention. FIG. 1 shows a peeling device 38 used in a die-bonding step similar to the die-bonding step shown in FIG. 10F, instead of the needle device 34 of FIG. 11. A plurality of silicon chips 16 are adhered to the dicing tape 24 and conveyed to a position between the peeling device 38 and the suction head 36.

The peeling device 38 includes a frame 40, a suction cap 42 arranged at the top of the frame 40, and a peeling head 44 arranged in the frame 40 so that it is exposed from the central opening of the suction cap 42. Further, the peeling device 38 includes a cam 46 and a motor 48 for operating the peeling head 44. The cam 46 is operatively connected to the motor 48 by pulleys 50 and 51 and a belt 52.

Figure 2:
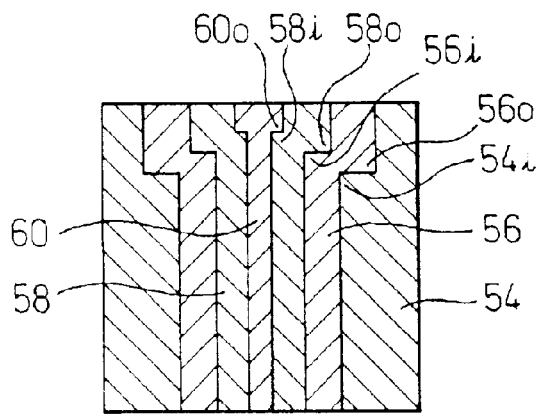
FIG. 2 is an enlarged sectional view showing the peeling head of FIG. 1.
Figure 3A:
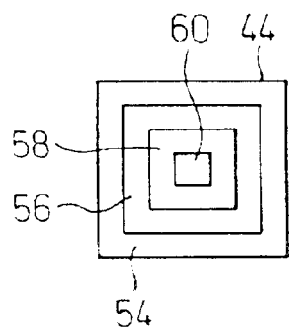
FIG. 3A is a plan view showing the surface of the peeling head of FIG. 1.
Figure 3B:
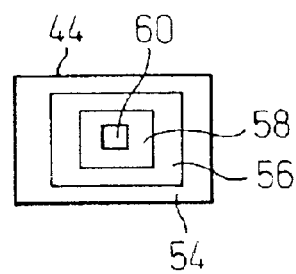
FIG. 3B is a plan view showing the surface of the modified peeling head.

FIG. 2 is an enlarged sectional view showing the peeling head 44. FIGS. 3A and 3B are plan views showing the surfaces of the peeling heads 44 of one and another examples. The peeling head 44 includes a plurality of annular contact members 54, 56, 58 and contact post member 60 are arranged one after another from the outside to the inside of the peeling head 44. The annular contact member 54 is located at the outermost position. The annular contact member 56 is slidably fitted in the annular contact member 54. The annular contact member 58 is slidably fitted in the annular contact member 56. The contact post member 60 is slidably fitted in the annular contact member 58.

In the example shown in FIG. 3A, the surfaces (and cross-sections) of the annular contact members 54, 56, 58 and contact post member 60 are formed in a square shape. In the example shown in FIG. 3B, the surfaces (and cross-sections) of the annular contact members 54, 56, 58 and contact post member 60 are formed in a rectangular shape. However, the shape of the surfaces (and cross-sections) of the annular contact members 54, 56, 58 and contact post member 60 are not limited to those of the above examples.

As shown in FIG. 2, the annular contact members 54, 56, 58 and contact post member 60 are formed in a stepped shape having a shoulder portion, respectively. The inner shoulder portion 54$i$ of the annular contact member 54 supports the outer shoulder portion 56$o$ of the annular contact member 56. The inner shoulder portion 56$i$ of the annular contact member 56 supports the outer shoulder portion 58$o$ of the annular contact member 58. The inner shoulder portion 58$i$ of the annular contact member 58 supports the outer shoulder portion 60$o$ of the contact post member 60. When all the shoulder portions come into contact with each other, the surfaces of the annular contact members 54, 56, 58 and contact post member 60 are aligned in a common plane.

When the annular contact member 54, which is located at the outermost position, is operated upward, all the contact members 54, 56, 58 and contact post member 60 are moved upward. When the annular contact member 56, which is located at the next outer position, is operated upward, the annular contact members 56, 58 and contact post member 60 are moved upward. When the annular contact member 58, which is located at the next outer position, is operated upward, the annular contact members 58 and contact post member 60 are moved upward. When the central contact post member 60 is operated, only the contact post member 60 is moved upward.

During one revolution of the cam 46, the cam 46 causes the outermost annular contact member 54 to move upward to the first position and to be maintained at this position, the next outer annular contact member 56 to move upward to the second position higher than the first position and to be maintained at this position, the next outer annular contact member 58 to move upward to the third position higher than the second position and to be maintained at this position, and the central contact post member 60 to move upward to the fourth position higher than the third position and to be maintained at this position.

Further, the interior of the frame 40 of the peeling device 38 is formed as a vacuum chamber, to which a vacuum tube 62 is connected. The vacuum tube 62 is also connected to a vacuum source (not shown). Vacuum introduced into the vacuum chamber acts on the dicing tape 24 arranged on the suction cap 42. The vacuum attracts the dicing tape 24 toward the suction cap 42 and the annular contact members 54, 56 and 58.

FIGS. 4A to 9B are views explaining the operation of the peeling device 38. In each of FIGS. 4B, 5B, 6B, 7B, 8B and 9B, the hatched portion shows a region of the silicon chip 16 adhered to the dicing tape 24. In a portion which is not hatched, the silicon chip 16 is peeled off from the dicing tape 24.

Figure 4A:
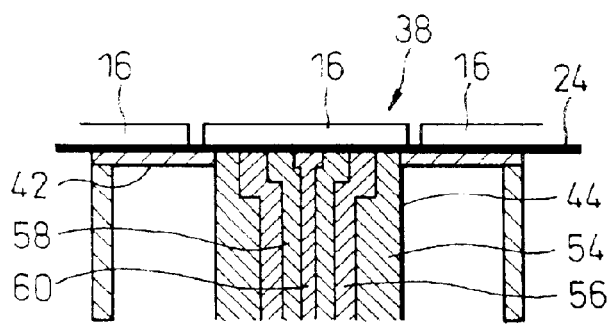
FIG. 4A is a sectional view explaining the operation of the peeling device shown in FIG. 1.
Figure 4B:
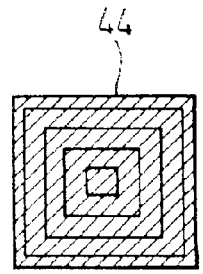
FIG. 4B is a plan view of the peeling head.

In FIGS. 4A and 4B, the annular contact members 54, 56, 58 and contact post member 60 of the peeling head 44 are located at the respective initial positions, and the dicing tape 24 to which the silicon chip 16 is adhered is located on the suction cap 42 and the annular contact members 54, 56, 58 and contact post member 60. Vacuum introduced from the vacuum tube 62 into the interior of the frame 40 acts on the dicing tape 24 and attracts the dicing tape 24 to the suction head 42.

Figure 5A:
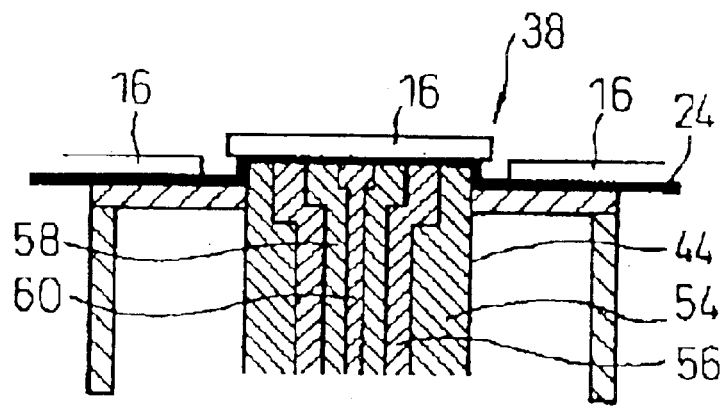
FIG. 5A is a sectional view explaining the operation of the peeling device shown in FIG. 1.
Figure 5B:
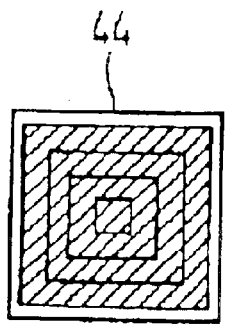
FIG. 5B is a plan view of the peeling head.

In FIGS. 5A and 5B, the outermost annular contact member 54 is moved upward to the first position. Therefore, all the annular contact members 54, 56, 58 and contact post member 60 are moved upward. The total area of the surfaces of all the annular contact members 54, 56, 58 and contact post member 60 are a little smaller than the area of the silicon chip 16. Accordingly, all the annular contact members 54, 56, 58 and contact post member 60 raise a large proportion of the silicon chip 16, except for the outermost circumferential portion of the silicon chip 16.

Vacuum acts on a portion of the dicing tape 24, which corresponds to the outermost circumferential portion of the silicon chip 16. Therefore, the dicing tape 24 is pulled downward. Accordingly, when all the annular contact members 54, 56, 58 and contact post member 60 move upward, the outermost circumferential portion of the silicon chip 16 around the outermost annular contact member 54 is peeled off from the dicing tape 24. That is, in the outermost circumferential portion of the silicon chip 16, air enters the interface between the silicon chip 16 and the dicing tape 24. In this case, a large proportion of the silicon chip 16 is supported by the annular contact members 54, 56, 58 and contact post member 60, and the radial width of the outermost circumferential portion of the silicon chips 16, which is peeled off from the dicing tape 24, is relatively small. Therefore, when the silicon chip 16 is peeled off from the dicing tape 24, an excessive force is not exerted onto the silicon chip 16. Further, since the outermost circumferential portion of the silicon chip 16, which is peeled off from the dicing tape 24, is continuous in the circumferential direction, no stress concentration is caused when the silicon chip 16 is peeled off from the dicing tape 24. Accordingly, the silicon chip 16 is not damaged.

Figure 6A:
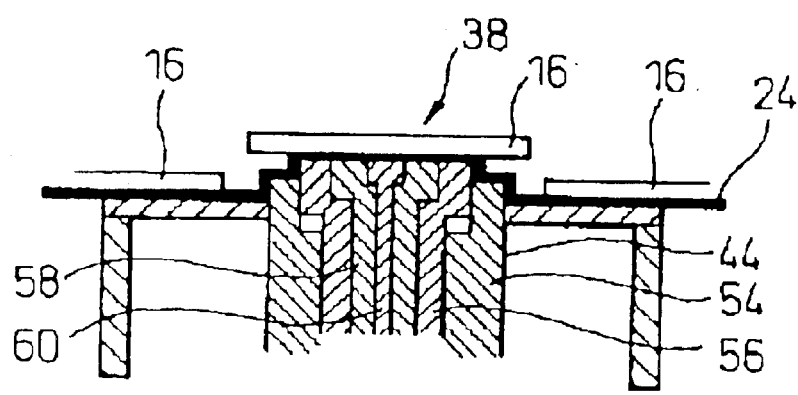
FIG. 6A is a view sectional explaining the operation of the peeling device shown in FIG. 1.
Figure 6B:
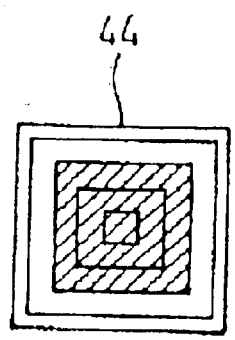
FIG. 6B is a plan view of the peeling head.

Next, in FIGS. 6A and 6B, the outermost annular contact member 54 is maintained at the first position and the next outer annular contact member 56 is moved upward to the second position, so that the annular contact members 56, 58 and contact post member 60 are moved upward. At this time, a portion of the silicon chip 16 corresponding to the outermost annular contact member 54 is peeled off from the dicing tape 24. That is, air enters the interface from the outside to the inside. In this case too, no excessive force is exerted on the silicon chip 16 when the silicon chip 16 is peeled off. Therefore, a portion of the silicon chip 16 is securely peeled off from the dicing tape 24.

Figure 7A:
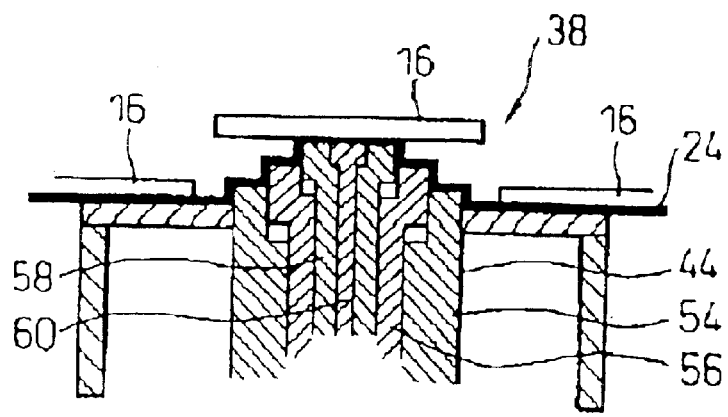
FIG. 7A is a sectional view explaining the operation of the peeling device shown in FIG. 1.
Figure 7B:
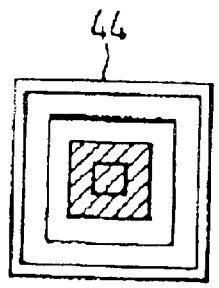
FIG. 7B is a plan view of the peeling head.

Next, in FIGS. 7A and 7B, the annular contact member 56 is maintained at the second position and next outer the annular contact member 58, is moved upward to the third position, so that the annular contact members 58 and contact post member 60 are moved upward. At this time, a portion of the silicon chip 16 corresponding to the annular contact member 56, which is located outside the annular contact member 58, is peeled off from the dicing tape 24. That is, air enters the interface from the outside to the inside.

Figure 8A:
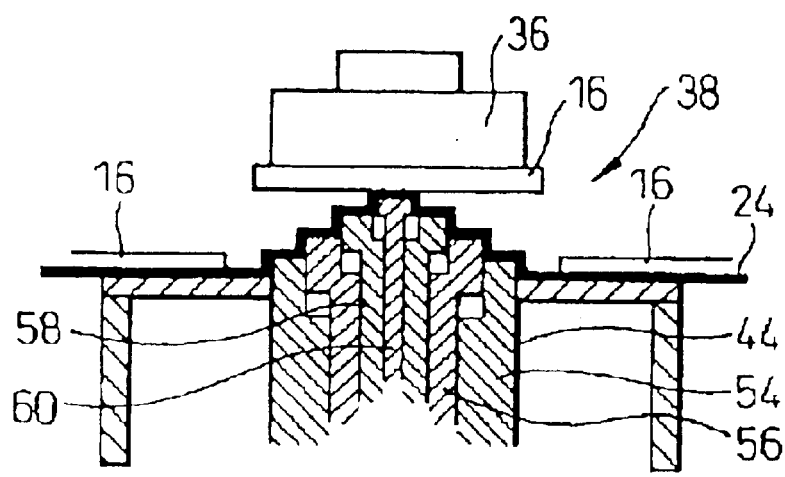
FIG. 8A is a sectional view explaining the operation of the peeling device shown in FIG. 1.
Figure 8B:
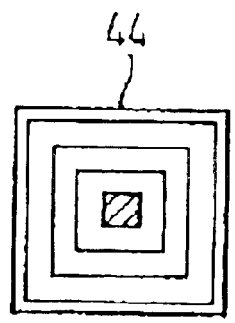
FIG. 8B is a plan view of the peeling head.

In FIGS. 8A and 8B, the annular contact member 58 is maintained at the third position and the central contact post member 60, is moved upward to the fourth position, so that the contact post member 60 is moved upward. At this time, a portion of the silicon chip 16 corresponding to the outer annular contact member 58, is peeled off from the dicing tape 24. That is, air enters the interface from the inside to the outside.

Figure 9A:
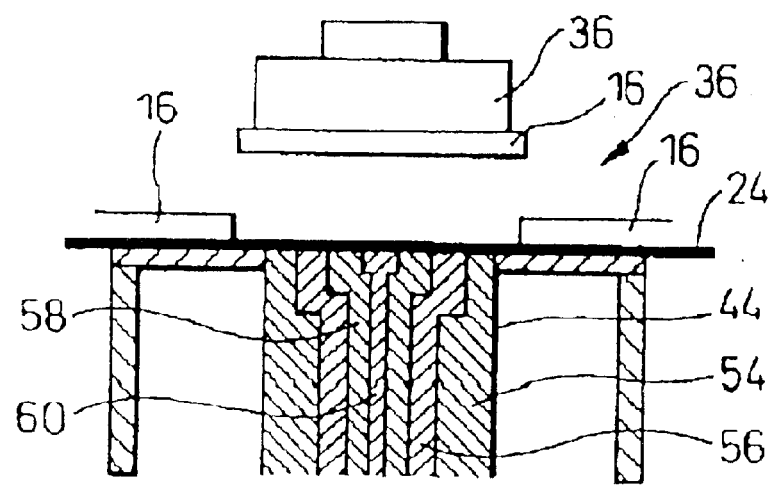
FIG. 9A is a sectional view explaining the operation of the peeling device shown in FIG. 1.
Figure 9B:
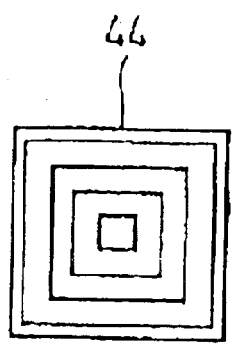
FIG. 9B is a plan view of the peeling head.

In FIGS. 9A and 9B, the suction head 36 is operated to attract the silicon chip 16, and the silicon chip 16 is moved upward. Accordingly, the silicon chip 16 is finally peeled off from the dicing tape 24. The silicon chip 16 can be easily and securely peeled off from the dicing tape 24, at the final stage, because the silicon chip 16 and the dicing tape 24 are adhered to each other only in a small portion corresponding to the central contact post member 60.

When the cam 46 is rotated one revolution, all the annular contact members 54, 56, 58 and contact post member 60 do not receive any upward pushing force from the cam 48 and are pushed downward by the dicing tape 24 on which a vacuum is acting. Therefore, all the annular contact members 54, 56, 58 and contact post member 60 return to the initial positions.

In this way, in the present invention, the semiconductor chip 16 is successively peeled off from the tape 24 from the outer circumferential portion toward the central portion. Accordingly, the semiconductor chip 16 can be securely peeled off from the tape 24 without damage. Further, the annular contact members 54, 56, 58 and contact post member 60 receive the semiconductor chip 16, not on points, but on continuous surfaces. Therefore, no stress concentration is caused when the semiconductor chip 16 is peeled off from the tape 24, and the semiconductor chip 16 is not deformed and cracked.

As explained above, according to the present invention, even when the thickness of a semiconductor chip is reduced, the semiconductor chip can be securely peeled off from the tape.

What is claimed is:

1. A method of peeling a semiconductor chip, comprising the steps of:
   peeling a semiconductor chip adhered to a tape from said tape by a peeling device including a plurality of displaceable contact members arranged in an order from an outer circumferential position to a central position all being housed inside a stationary contact member,
   wherein the plurality of displaceable contact members are operated and displaced relative to each other so that the semiconductor chip is successively peeled off from the tape from the outer circumferential position thereof toward the central position, wherein the plurality of displaceable contact members are simultaneously moved, and then, an outermost displaceable contact member in the plurality of displaceable contact members is stopped and the remaining displaceable contact members are further moved simultaneously.

2. A method of peeling a semiconductor chip, comprising the steps of:

peeling a semiconductor chip adhered to a tape from said tape by a peeling device including a plurality of displaceable contact members arranged one after another from the outside to the inside, wherein the plurality of displaceable contact members are operated so that the semiconductor chip is successively peeled off from the tape from an outer circumferential portion thereof toward a central portion thereof; and wherein the plurality of displaceable contact members are simultaneously moved, and then, the outermost displaceable contact member in the plurality of displaceable contact members is stopped and the remaining displaceable contact members are further moved simultaneously.

* * * * *